United States Patent [19]

Ozawa

[11] Patent Number: 4,684,916

[45] Date of Patent: Aug. 4, 1987

[54] CHIP RESISTOR

[75] Inventor: Juichiro Ozawa, Kyoto, Japan

[73] Assignees: Susumu Industrial Co., Ltd., Kyoto; Thin Film Technology Corporation, North Mankato, both of Japan

[21] Appl. No.: 839,206

[22] Filed: Mar. 11, 1986

[30] Foreign Application Priority Data

Mar. 14, 1985 [JP] Japan .................................. 60-52126

[51] Int. Cl.[4] .......................................... H01C 1/012
[52] U.S. Cl. .................................... 338/308; 338/309; 338/327; 338/329; 338/314; 361/403
[58] Field of Search ................................ 338/306–309, 338/314, 324, 327, 329; 29/610; 361/400, 403

[56] References Cited

U.S. PATENT DOCUMENTS

| | | | |
|---|---|---|---|
| 3,761,860 | 9/1973 | Ogasawara et al. | 338/309 X |
| 4,204,187 | 5/1980 | Kukuhashi et al. | 338/307 |
| 4,339,785 | 7/1982 | Ohsawa | 361/400 |

FOREIGN PATENT DOCUMENTS

| | | | |
|---|---|---|---|
| 2755926 | 6/1978 | Fed. Rep. of Germany | 361/400 |
| 2037489 | 7/1980 | United Kingdom | 361/400 |

Primary Examiner—C. L. Albritton
Attorney, Agent, or Firm—Berman, Aisenberg & Platt

[57] ABSTRACT

In a chip resistor made of thin film having its connecting electrodes for connecting the resistor to a substrate, the connecting electrodes are coated with electrical conducting paint then soldering is performed so as to ensure soldering of the connecting electrodes to the substrate.

6 Claims, 4 Drawing Figures

CHIP RESISTOR

FIELD OF THE INVENTION

The present invention relates to a chip resistor.

BACKGROUND OF THE INVENTION

Chip resistors which are small sized resistors made with a film technique are generally used in printed circuit boards with various small sized electronic components such as integrated circuits. The chip resistor is formed in a manner such as that shown in FIG. 1. A chip resistor element 2 is formed on a substrate 1 made of electrical insulating material such as ceramic material or glass by a thin film technique. The top surface of the chip resistor is covered by a suitable plastic resin layer 15 for the mechanical protection and humidity protection of the chip resistor. There are formed connection electrodes 5a on the top surface of the connecting portions 4 of the chip resistor 2, connecting electrodes 5b and 5c on both side surfaces and bottom surface of the substrate 1. The respective connecting electrodes 5a, 5b and 5c are formed of Ni-Cu alloy by sputtering or vacuum evaporation. The chip resistor is laid on the surface of a printed circuit board 3 with the connecting electrodes aligned with suitable metal connecting patterns formed on the top surface of the printed circuit board 3, then soldering 6 is performed to mechanically connect between each connecting electrodes 5a through 5c and the connecting pattern of the printed circuit board so that the chip resistor is secured on the printed circuit board 3.

In the conventional way of securing the chip resistor on the printed circuit board, there tends to be formed interruption of soldering as shown at 7 in a corner space between the connecting electrodes 5a through 5b and the edge surface of the electrodes is undesirably uncovered whereby connection between the chip resistor and the printed circuit board becomes weak.

In addition, a part of the protection layer 15 near the connecting electrode is melted by heat at the time of soldering, whereby there is also formed an exposed part which is not covered by the protection layer 15, resulting in decreasing the humidity protection of the chip resistor.

SUMMARY OF THE INVENTION

An essential object of the present invention is to provide a chip resistor which enables the increase of the mechanical connection between the chip resistor and the printed circuit board and humidity protection of the chip resistor.

A further object of the present invention is to provide a chip resistor which allows an to easily formed soldering layer fully covering the connecting electrodes of the chip resistor and the printed circuit board.

According to the present invention there is provided a chip resistor which comprises chip resistor element formed on a substrate, printed circuit board circuit means for fixedly supporting the chip resistor element, inner electrode means formed on the chip resistor element, electrical conductive paint layer means formed covering the connecting electrode means, outer electrode means formed covering a portion of the electrical conductive paint layer means and soldering means coated between the outer electrode means and metallic pattern means formed on the printed circuit board means.

BRIEF DESCRIPTION OF THE ATTACHED DRAWINGS

FIG. 1 is a cross sectional view showing an example of a conventional way of securing the chip resistor on the printed circuit board, FIGS. 2 (a) to 2 (c) are respectively cross sectional views showing a process of securing a chip resistor on a print circuit board according to the present invention.

DETAILED DESCRIPTION OF THE PREFERRED EMBODIMENT

Figure 2A:
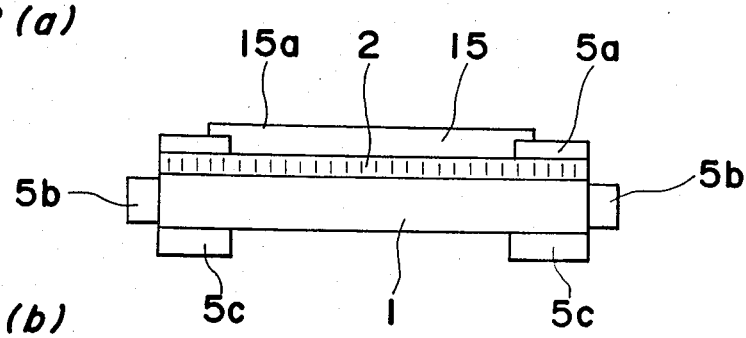
Figure 2B:
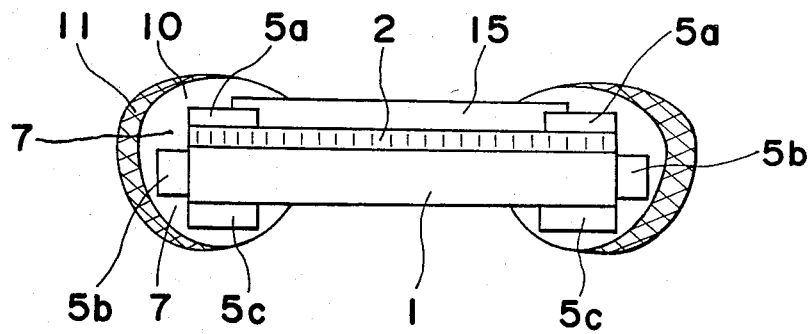
Figure 2C:
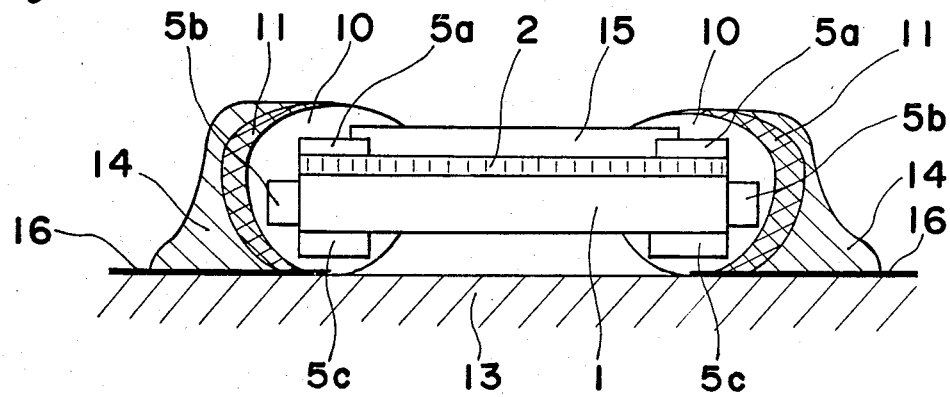

Referring to FIG. 2 (a), a chip resistor element 2 made is formed on a substrate 1 of electric insulating materials such as ceramics or glass by a thin film technique. The chip resistor element 2 is formed by sputtering or vacuum evaporation. Connecting electrodes 5a, 5b and 5c are formed in the form of thin layer of Ni-Cu alloy on the top surface, side surface and bottom surface of the both end portions of the chip resistor. In the example, the substrate 1 has 2 mm width, 1.25 mm length and 0.4 mm thickness. The connecting electrode 5a, 5b and 5c are 0.3 μm thickness. The respective sizes mentioned above are only example and various sizes can be selected as desired.

A protection layer 15 is formed to cover the top surface of the chip resistor element 2. The protection layer 15 may be formed by coating paint made of plastic resin material on the top surface of the chip resistor element 2 and the substrate 1 i.e., the surface of the chip resistor element opposite to the substrate. Subsequently, layers 10 made of electrical conductive paint containing silver powder or copper powder is coated to cover the surface of the connecting electrodes 5a, 5b and 5c and the respective spaces 7 between the electrodes including the spaces between the electrodes 5a and the end portion of the protection layer 15 as shown in FIG. 2 (b). The electrical conductive paint layers 10 are formed on both end portions of the chip resistor element 2. The coating of the electrical conductive paint may be made by blowing, painting or other suitable known method. As the example of the electrical conductive paint, DO-TIGHT E1 or SH - 1 may be used. The electrical conductive paint layer 10 is, for example, 10 to 100 μm thick.

After the electrical conductive paint layers 10 are formed on both end portions of the chip resistor element 2, electrode layers 11 are formed to cover the outer surface of the electrical conductive paint layer 10 mainly containing the side surface and bottom surface of the electrical conductive paint layer 10 by sputtering or vacuum evaporation. The outer electrode layer 11 is made of Ni-Cu alloy with 0.1 to 10 μm thick. The electrode layers 11 may be preferably formed after the electrical conductive paint layer 10 is cured. However, the electrode layer 11 may be coated before the electrical conductive paint layer 10 is cured.

Figure 1:
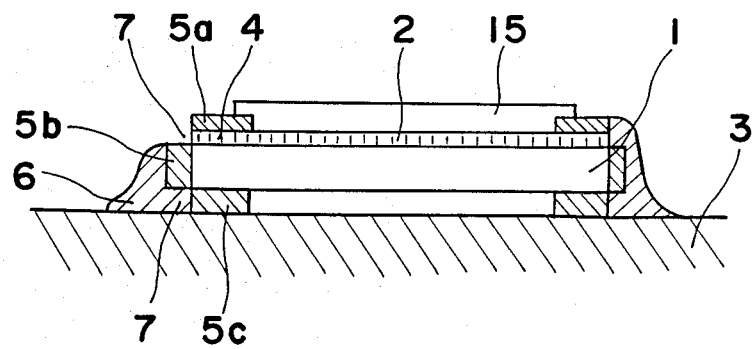

Subsequently, as shown in FIG. 2 (c), the substrate 1 is laid on a printed circuit board 13 so that the electrode layers 11 coincide with the metallic pattern 16 formed on the surface of the printed circuit board 13, and soldering 14 is formed between the electrode layer 11 and the metallic patterns 16 on both sides of the chip resistor to secure the chip resistor with the printed circuit board 13. In this way, the chip resistor element 2 can be connected to the pattern without causing any space at the corner of the connecting electrode shown at 7 in FIG. 1. Namely it becomes possible to connect the respective electrodes 5a, 5b and 5c without occurrence of interruption of soldering between the electrodes 5a to 5c, whereby the mechanical strength of the connection between the chip resistor and the print circuit board can be increased. Also, the humidity protection of the chip resistor can be increased. Moreover, the electric conductive paint layer coated on the connecting electrode acts as an elastic member so that the vibration resistance of the chip resistor can be improved. Furthermore, since the soldering is easily filled around the connecting electrodes, productivity of the chip resistors can be increased.

What is claimed is:

1. A chip resistor which comprises a chip resistor element formed on a substrate, printed circuit board circuit means for fixedly supporting the chip resistor element, connecting electrode means formed on the chip resistor element, electrical conductive paint layer means formed covering the connecting electrode means, outer electrode means formed covering a portion of the electrical conductive paint layer means and soldering means coated between the outer electrode means and metallic pattern means formed on the printed circuit board means.

2. The chip resistor according to claim 1, wherein said connecting electrode means, electrical conductive paint layer means, outer electrode means and soldering means are on end portions of the chip resistor element.

3. The chip resistor according to claim 1, wherein said electrical conductive paint layer contains silver powder.

4. The chip resistor according to claim 1, wherein a surface of the chip resistor element opposite the substrate is covered by a protection layer made of plastic resin materials.

5. The chip resistor according to claim 4, wherein said electrical conductive paint layer covers the connecting electrode means and an end portion of the protection layer near the connecting electrode means.

6. The chip resistor according to claim 1 wherein said electrical paint layer contains copper powder.

* * * * *